(12) United States Patent
Auer-Jongepier et al.

(10) Patent No.: US 7,145,643 B2
(45) Date of Patent: Dec. 5, 2006

(54) INTERFACE UNIT, LITHOGRAPHIC PROJECTION APPARATUS COMPRISING SUCH AN INTERFACE UNIT AND A DEVICE MANUFACTURING METHOD

(75) Inventors: Suzan Leonie Auer-Jongepier, Valkenswaard (NL); Pieter Johannes Marius Van Groos, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 153 days.

(21) Appl. No.: 10/912,571

(22) Filed: Aug. 6, 2004

(65) Prior Publication Data

US 2005/0030511 A1 Feb. 10, 2005

(30) Foreign Application Priority Data

Aug. 7, 2003 (EP) .................................. 03077470

(51) Int. Cl.
- G03B 27/58 (2006.01)
- G03B 27/42 (2006.01)
- G03D 5/00 (2006.01)

(52) U.S. Cl. ............................ 355/72; 355/53; 396/611

(58) Field of Classification Search .................. 355/27, 355/53, 72, 76; 396/611; 118/719
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,788,868 A * | 8/1998 | Itaba et al. | .................... 216/41 |
| 5,969,441 A | 10/1999 | Loopstra et al. | |
| 6,046,792 A | 4/2000 | Van Der Werf et al. | |
| 6,147,329 A | 11/2000 | Okamura et al. | |
| 6,585,430 B1 * | 7/2003 | Matsuyama et al. | ........ 396/611 |
| 6,814,809 B1 * | 11/2004 | Matsushita et al. | ......... 118/666 |
| 2002/0024645 A1 | 2/2002 | Nakano | |
| 2002/0076658 A1 | 6/2002 | Matsushita et al. | |
| 2003/0044261 A1 * | 3/2003 | Bonora et al. | ........... 414/217.1 |

FOREIGN PATENT DOCUMENTS

| | | |
|---|---|---|
| EP | 0 809 284 | 11/1997 |
| EP | 0 883 030 | 12/1998 |
| JP | 2000-315644 | 11/2000 |
| WO | WO 98/33096 | 7/1998 |
| WO | WO 98/38597 | 9/1998 |
| WO | WO 98/40791 | 9/1998 |

* cited by examiner

Primary Examiner—Henry Hung Nguyen
(74) Attorney, Agent, or Firm—Pillsbury Winthrop Shaw Pittman, LLP

(57) ABSTRACT

An interface unit for transferring objects, such as substrates, is presented. The interface unit includes a first object transfer path to transfer objects between a track configured to process objects and a lithographic exposure unit configured to expose objects, wherein the interface unit is also provided with a second object transfer path extending through a closable transfer opening to an external space to transfer objects between the external space and the lithographic exposure unit. Furthermore, the invention relates to a lithographic apparatus provided with a lithographic exposure unit and an interface unit according to the invention.

25 Claims, 5 Drawing Sheets

INTERFACE UNIT, LITHOGRAPHIC PROJECTION APPARATUS COMPRISING SUCH AN INTERFACE UNIT AND A DEVICE MANUFACTURING METHOD

PRIORITY INFORMATION

This application claims priority from European Patent Application No. 03077470.7, filed Aug. 7, 2003, the content of which is herein incorporated by reference in its entirety.

BACKGROUND

1. Field of the Invention

The present invention relates to lithographic apparatus and methods

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time.

In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The term "patterning device" used herein should be broadly interpreted as referring to a device that can be used to endow an incoming radiation beam with a patterned cross-section, corresponding to a pattern that is to be created in a target portion of the substrate. Generally, the pattern will correspond to a particular functional layer in a device being created in the target portion, such as an integrated circuit or other device (see below). Examples of such patterning means include:

1. A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

2. A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and 3. A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

A conventional lithographic system has a lithographic exposure unit connected to a track. The track is provided with multiple stations for processing the objects and a transport system for transferring the objects between the stations and the exposure unit. Generally, the track is elongated with a loading/unloading unit for the objects on the one side and coupled to the exposure unit on the other side. The stations are positioned along the track. In use, the transport system transfers the objects multiple times along the track between the stations and the exposure unit for generating a multiple layer configuration on the object.

In such a lithographic system, objects have to be transferred to the exposure unit after loading via the loading/unloading unit and subsequent transfer by the transport system along the elongated track. In case of failure of the transport system, there is a stand still of the conventional lithographic system.

SUMMARY

Embodiments of the invention include an interface unit to transfer objects such as substrates between a lithographic exposure unit configured to expose objects and a track configured to process (baking, developing) objects. Another embodiment of the invention includes a device manufacturing method wherein the object is provided to the lithographic exposure unit via an interface unit according to the invention.

According to an embodiment of the invention, an interface unit is configured to reduce the possibility of a stand still of the lithographic system. An interface unit for transferring objects such as substrates includes, in an embodiment of the invention, a first object transfer path for transferring objects between a track for processing objects and a lithographic exposure unit for exposing objects, wherein the interface unit is also provided with a second object transfer path extending through a closable transfer opening to an external space for transferring objects between the external space and the lithographic exposure unit. In an embodiment of the invention, the first object transfer path and the second object transfer path are connected. Then, objects can be fed from the external space (outside world), via the respective second object transfer path and the first object transfer path, into the lithographic exposure unit, such that the system can continue operation even in case of a mal-functioning transport system of the track. In this way the track can be bypassed by exchanging objects at the side of the track opposite to the location of the loading/unloading unit.

In an embodiment of the invention, there is provided an interface unit including: a first object transfer path to transfer objects between a track configured to process objects and a lithographic exposure unit configured to expose objects, and a second object transfer path extending through a closable transfer opening to an external space to transfer objects between the external space and the lithographic exposure unit.

In an embodiment of the invention, the closable second transfer opening of the interface unit includes a front opening universal pod interface (FOUP-interface) configured to engage with a FOUP to carry objects or a Standard Mechanical Interface (SMIF) configured to engage a SMIF-Pod.

In another embodiment of the invention, the interface unit is arranged to be coupled to a Load Lock of a lithographic exposure unit such as an Extreme UltraViolet (EUV) projection unit having an enclosed vacuum space provided with a second opening closable by the Load Lock, wherein the first object transfer path extends through the second opening into the vacuum space. The Load Lock is used to bridge pressure differences such as an atmospheric gas pressure in the track versus a vacuum condition (a vacuum condition being defined as an environment with a gas pressure which is small compared to an atmospheric gas pressure) in the vacuum space. The interface unit provides the possibility of feeding objects into an atmospheric inner space of the interface unit. Subsequently, the objects can be fed via the first object transfer path, via the Load Lock, into the vacuum space of the lithographic exposure unit. In this embodiment, conventional carriers (FOUPS, SMIF Pods etc.) may be used for bypassing the track of the (EUV) system.

According to an embodiment of the invention, the interface unit is provided with a station configured to hold objects in the interface unit, whereby the at least one station is provided with one or more of the following functions: buffering of objects, cleaning of objects, pre-processing (pre-treatment such as pre-exposure baking) of objects, post-processing (post-treatment such as post-exposure baking) of objects. The respective functions will be discussed in more detail hereinafter.

Generally, the timing in a conventional track is based on the pre-determined cycle time of the objects in the track (thus based on a rigid time clock). Generally, the timing in the lithographic projection apparatus is based on events which the objects have to undergo (thus the basis is an event driven timing). These two different timing principles may yield a timing problem with respect to the exchange of objects between the track and the lithographic apparatus. According to an embodiment of the invention the communication between the track and the lithographic projection apparatus is improved in order to prevent (or at least reduce as much as possible) such timing problems. The buffer function (buffer positions associated with the at least on station) can be used such that the lithographic apparatus can be provided with objects when the apparatus is ready. In this way the chance on an unwanted stand still is relatively small.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Such a lithographic projection apparatus usually cooperates with a track, the track being coupled to the lithographic projection apparatus in such a way that the track and the lithographic projection apparatus can exchange substrates, as will be known to a person skilled in the art. The substrates may undergo all kinds of treatments in the track, such as a priming, resist coating, a soft bake, a post-exposure bake (PEB), development, a hard bake and measurement/inspection of the imaged features, as was already stated above.

According to an embodiment of the invention, the lithographic projection apparatus includes a first control unit, the interface unit includes a second control unit and the track includes a third control unit, the first, second and third control units being configured to communicate with each other.

According to an embodiment of the invention, the lithographic projection apparatus and the interface unit include a first control unit and the track includes a second control unit, the first and second control units being configured to communicate with each other.

According to an embodiment of the invention, the lithographic projection apparatus includes a first control unit and the interface unit and the track include a second control unit, the first and second control units being configured to communicate with each other.

The three embodiments mentioned above embody different ways of controlling the interface unit. The interface unit can be provided with its own control unit or may be controlled by a control unit of the lithographic projection apparatus or by a control unit of the track. Which embodiment is most useful depends on the situation. For example, if the interface unit uses the robot handler provided in the lithographic projection apparatus, it might be advantageous to control the interface unit with the control unit provided in the lithographic projection apparatus.

According to an embodiment of the invention, the interface unit further includes a robot handler configured to handle the substrate between the interface unit and at least one of the lithographic projection apparatus and the track. An interface unit provided with a robot handler is capable of independently handling substrates without needing assistance of a robot handler of the track and/or the lithographic projection apparatus.

According to an embodiment of the invention, the at least one station includes a buffer station configured to temporarily store a substrate. A buffer station helps increase the throughput since differences in handling rates between the lithographic projection apparatus and the track and vice versa can be damped out using the buffer station. It can also help provide a constant traveling time from the lithographic projection apparatus to the post-treatment in order to improve the quality of the substrates produced. In order to produce substrates with good and constant quality, the time between the exposure and the post-exposure bake should be limited and constant. The line thickness of the pattern projected in the resist can change between the exposure and the post-exposure bake and also the sharpness of the pattern can deteriorate. Therefore, an optimum quality is achieved if the time gap between the exposure and the post-exposure bake is reduced, and, most important, is constant for all substrates.

According to an embodiment of the invention, the at least one interface station includes a post-treatment station configured to give the substrate a treatment, such as a post exposure bake, after the substrate is delivered from the lithographic projection apparatus to the interface unit. By giving the substrate a post-exposure treatment in the interface unit, the time between the exposure of the substrate and the next treatment can be kept constant and can also be minimized. The negative effects of differences in throughput rates between the lithographic projection apparatus and the track are thus reduced.

According to an embodiment of the invention, the at least one station includes a pre-treatment station configured to give the substrate a treatment, such as a pre-bake, before making the substrate available to the lithographic projection apparatus. Such a pre-treatment, such as a pre-bake, can increase the quality of the produced chips. The pre-bake helps decrease outgassing of molecules from the substrate, minimizing the contamination as a result thereof inside the lithographic projection apparatus. This is relevant in a situation wherein an object such as a substrate enters the vacuum conditions in the lithographic projection apparatus (via the load lock) and then in the vacuum conditions has an enlarged chance of outgassing without such a pre-bake treatment. Gasses resulting form the outgassing may disturb the vacuum and may also contaminate the inside of the lithographic projection apparatus.

According to an embodiment of the invention, the at least one station includes a cleaning station configured to clean a substrate. Providing a cleaning station in the interface unit helps enable improved cooperation between a lithographic projection apparatus and a track, where the track and its output do not fulfill the contamination requirements set by the lithographic projection apparatus. Contamination detection can be performed at the station, for example, by using a particle scanning system. This can be done using a laser beam that scans the surface of the substrate. This is desirable since the lithographic process is very vulnerable to contamination by particles. Therefore it is desirable that the objects (substrates) that enter the lithographic projection apparatus be clean and that they do not bring along any contamination particles. However, objects (substrates) delivered to the lithographic projection apparatus by a track are often contaminated, which can have a negative effect on the working of the lithographic projection apparatus. The manufacturer of the lithographic projection apparatus typically has only limited influence on the track used by its customer and such tracks do not always deliver objects (substrates) that fulfill the demands concerning contamination of the lithographic projection apparatus. Failure to meet these demands could, for example, result in more frequent cleaning operations of the lithographic projection apparatus, which limits the production capacity of the lithographic projection apparatus and reduces the output of good substrates per hour.

According to an embodiment of the invention, the at least one station includes an exchange station configured to exchange substrates towards a space outside the lithographic projection apparatus and the track. The exchange station makes it possible to by-pass the track. Substrates can be delivered and received from the lithographic projection apparatus via the exchange station without using the track. This exchange station is particularly useful in cases where the lithographic projection apparatus is kept at a vacuum and direct exchanging of substrates with the outside world is not possible without providing additional hardware, such as a load lock.

According to an embodiment of the invention, the exchange station includes a front opening universal pod interface configured to engage with a front opening universal pod. The front opening universal pod (FOUP) is a carrier configured to transport substrates that is commonly used in the field of integrated circuits. In another embodiment the exchange station includes a Standard Machine Interface Pod (SMIF-Pod).

According to an embodiment of the invention, the interface unit is connected to the lithographic projection apparatus via a load lock. A load lock can be used in cases where different pressures are maintained in the lithographic projection apparatus and the track, e.g., when the lithographic projection apparatus is held at a pressure substantially lower than the track.

According to an embodiment of the invention, the lithographic projection apparatus is held at a vacuum.

According to a further embodiment of the invention, there is provided a lithographic projection apparatus including a radiation system configured to provide a beam of radiation; a support structure configured to support a patterning device, the patterning device serving to pattern the beam of radiation according to a desired pattern; a substrate table configured to hold a substrate; and a projection system configured to project the patterned beam onto a target portion of the substrate, wherein the lithographic projection apparatus includes an interface unit according to one of the above described embodiments.

According to an embodiment of the invention, there is provided a device manufacturing method including providing a substrate that is at least partially covered by a layer of radiation-sensitive material; providing a beam of radiation using a radiation system; using a patterning device to endow the projection beam with a pattern in its cross-section; and projecting the patterned beam of radiation onto a target portion of the layer of radiation-sensitive material, wherein the substrate is provided via an interface unit according to an embodiment of the invention.

A lithographic projection apparatus according to an embodiment of the invention also includes a lithographic exposure unit including a radiation system configured to provide a beam of radiation; a support structure configured to support a patterning device, the patterning device configured to pattern the beam of radiation according to a desired pattern; a substrate holder configured to hold a substrate; a projection system configured to project the patterned beam of radiation onto a target portion of the substrate; and an interface unit according to claim 1, wherein the interface unit is coupled to the lithographic exposure unit.

A device manufacturing method according to an embodiment of the invention also includes transferring a substrate to an exposure unit or a track unit via separate paths of an interface unit coupled to the exposure unit and the track unit; providing a beam of radiation using a radiation system; patterning the beam of radiation with a pattern in its cross-section; and projecting the patterned beam of radiation onto a target portion of a layer of radiation-sensitive material on the substrate.

In another embodiment of the invention, there is provided a lithographic system including a lithographic exposure unit configured to expose a substrate; a track unit including a plurality of processing stations configured to process the substrate; and an interface unit operatively associated with the lithographic exposure unit and the track unit, the interface unit being configured to transfer the substrate between the lithographic exposure unit and the track unit, the interface unit being further capable of receiving a substrate from a structure other than the lithographic exposure unit or the track unit and further capable of transferring the substrate from the other structure to the lithographic exposure unit and/or the track unit.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc.

The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
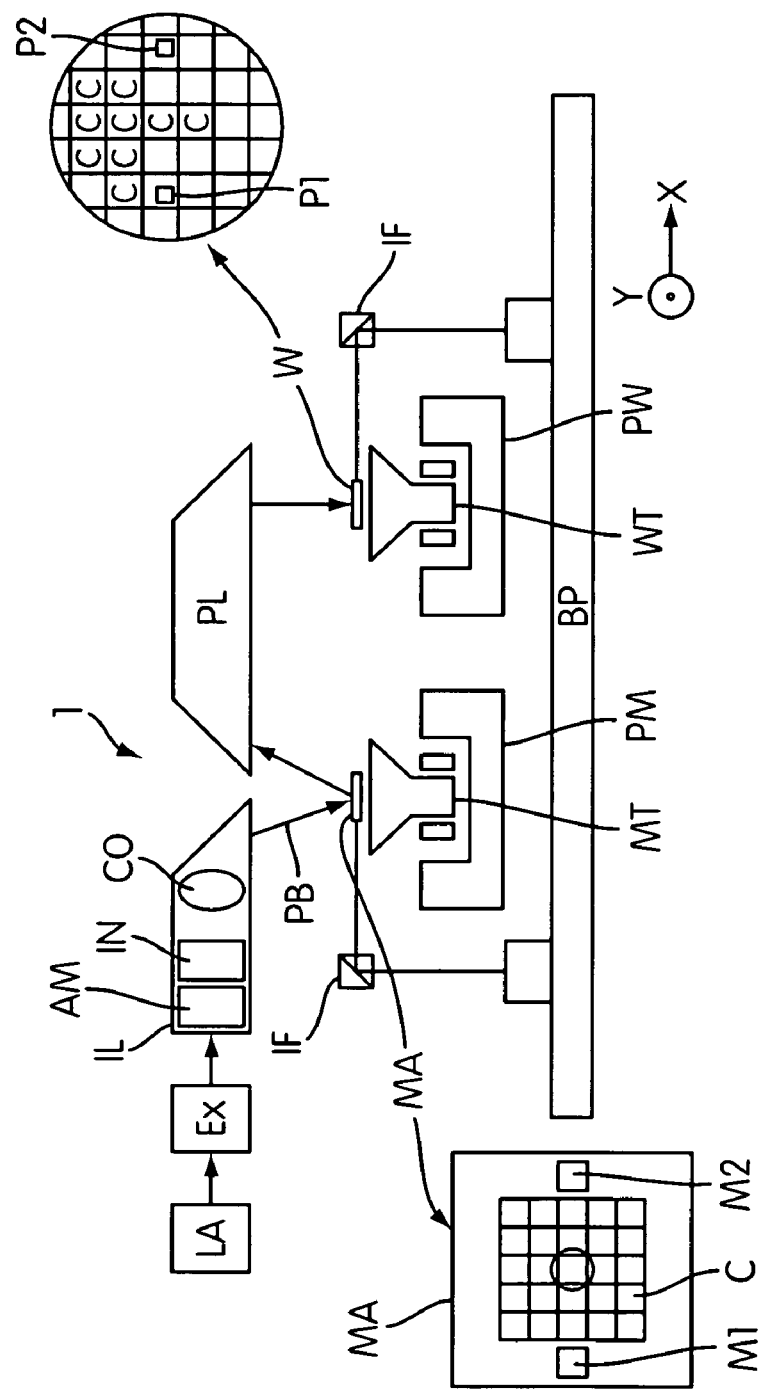
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL, configured to supply a beam PB of radiation (e.g. EUV radiation). In this particular case, the radiation system also includes a radiation source LA. The apparatus also includes a first object table (mask table) MT provided with a mask holder configured to hold a mask MA (e.g. a reticle), and connected to a first positioning device PM configured to accurately position the mask with respect to the projection system ("lens"), item PL, The apparatus further includes a second object table (substrate table) WT provided with a substrate holder configured to hold a substrate W (e.g. a resist-coated silicon wafer), and connected to a second positioning device PW configured to accurately position the substrate with respect to the projection system ("lens"), item PL, the projection system ("lens") PL (e.g. mirrors or lenses) being configured to image an irradiated portion of the mask MA onto a target portion C (e.g. including one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a EUV source) produces a beam of radiation. This beam is fed into an illumination system (illuminator) IL, either directly or after having traversed a conditioning device, such as a beam expander Ex, for example. The illuminator IL may comprise an adjusting device AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

1. In step mode, the mask table MT is kept essentially stationary, and an entire mask image is projected all at once (i.e. in a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed V, so that the beam of radiation PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2A:
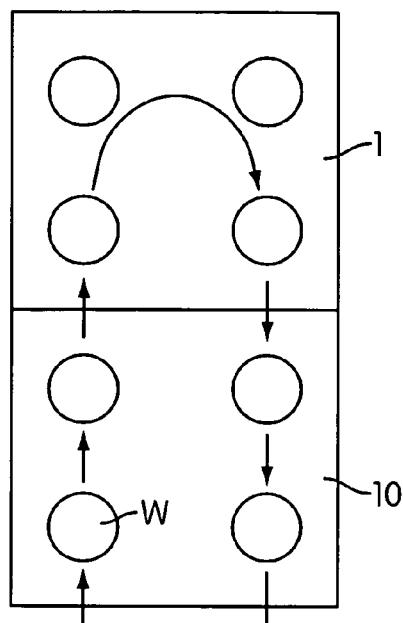
FIGS. 2a and 2b depict a conventional lithographic projection apparatus and a track.
Figure 2B:
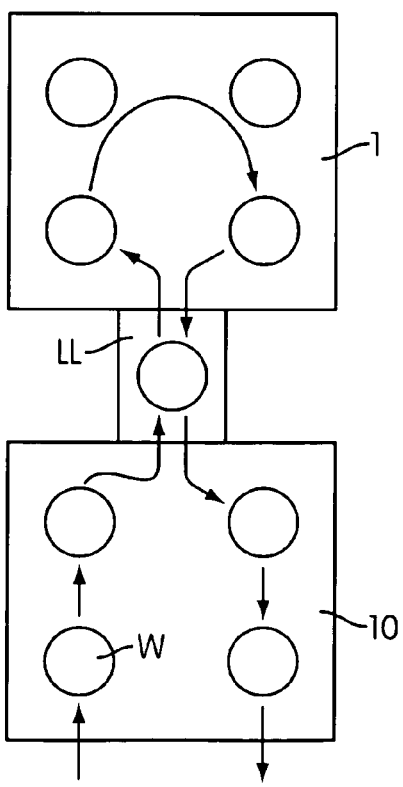

FIGS. 2a and 2b show a conventional lithographic exposure unit 1 and a track 10. FIG. 2a shows a lithographic exposure unit 1 and a track 10 and also shows a substrate W (such as a wafer or a flat panel substrate etc.) traveling though the track 10, the lithographic exposure unit 1 and back through the track 10.

In the embodiment depicted in FIG. 2b, the lithographic exposure unit employs EUV radiation for exposure and has at least an exposure chamber kept under vacuum. At the interface between the lithographic exposure unit 1 and the track 10 (which is at atmospheric or other pressure) a load lock LL is provided. The arrows schematically depict the route of a substrate, such as a wafer W, through the track 10, the load lock LL, the lithographic exposure unit 1, the load lock LL again and through the track 10 again. The substrate W is transported and handled using handling robots, that are not shown in the figure.

The embodiment discussed below concerns a lithographic exposure unit 1 using EUV radiation for the beam of radiation PB, so the lithographic exposure unit is kept under vacuum (FIG. 2b). However, it will be understood that the invention as presented here can also advantageously be applied to non-EUV and non-vacuum lithographic exposure unit, as, for example, depicted in FIG. 2a.

Figure 3A:
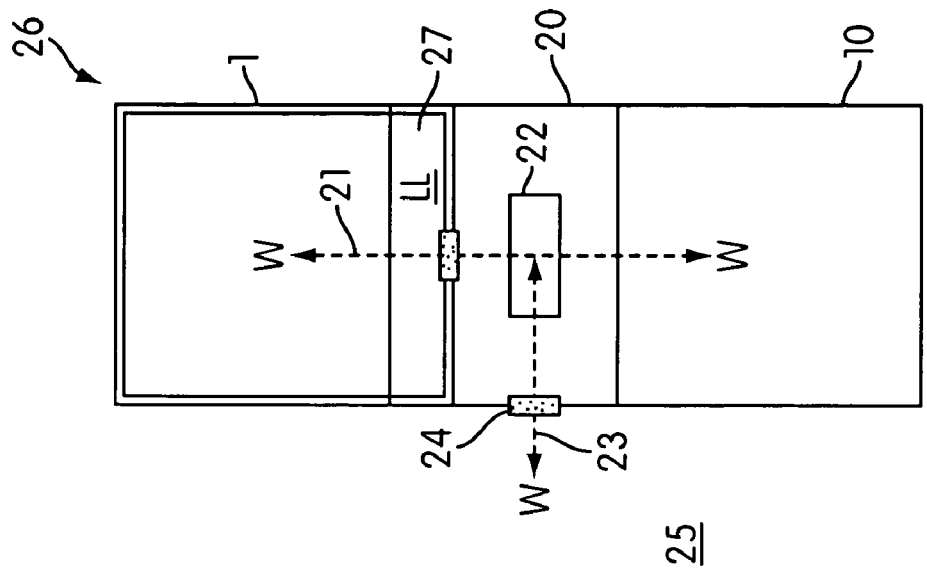
FIGS. 3a and 3b depict a lithographic exposure unit, a track and an interface unit according to an embodiment of the present invention.

FIG. 3A depicts a track 10 configured to process objects and a lithographic exposure unit 1 configured to expose objects. Furthermore, FIG. 3A depicts an interface unit 20 configured to transfer objects such as substrates W between the track 10 and the lithographic exposure unit 1. The interface unit 20 is connected to the track 10 and the lithographic exposure unit 1. The interface unit 20 has a first object transfer path 21 for the regular transport of objects (substrates, wafers) between the track 10 and the exposure unit 1. The interface unit 20 can be provided with a robot configured to transfer or transport the objects. The lithographic apparatus (here defined to include the interface unit 20 and the lithographic exposure unit 1) can be provided with a wafer handler for temperature control and pre-alignment of the objects. The interface unit 20 includes at least one station 22 configured to hold the objects in the first object transfer path. This station 22 can be used for integrating several functions in the interface unit 20, as explained in more detail in the following description.

The interface unit 20 is also provided with a second object transfer path 23 which is connected with the first object transfer path 21. The second transfer path 23 can be used to by-pass the part of the first transfer path 21 which connects the interface unit 20 to the track 10. The second transfer path 23 extends through a closable second transfer opening 24 to an external space (in this case the outside world 25). Substrates can be transferred from the outside world 25 into the lithographic system 26 via the second transfer path 23 and the first object transfer path 21 (and vice versa). For this transfer, use can be made of a conventional FOUP if the closable second opening 24 is provided with a conventional FOUP interface. As an alternative, a so-called SMIF interface and a SMIF Pod can be used.

Figure 3B:
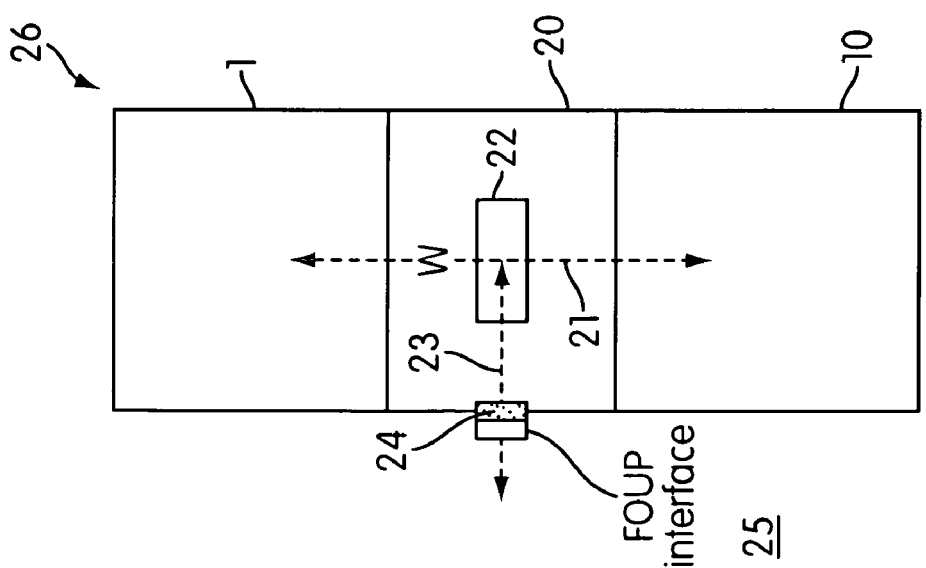

FIG. 3B shows a configuration wherein the lithographic exposure unit 1 is an Extreme UltraViolet exposure unit 1. The inner space of this exposure unit may be kept under vacuum during operation. The exposure unit 1 is provided with a Load Lock 27 configured to bridge pressure differences between the interface unit 20 and the inner space of the exposure unit 1. The first object transfer path is, via a closable opening of the Load Lock, connected to the inner space of the EUV exposure unit 1. Objects such as substrates (for example wafers) can be fed into the lithographic system 26 in an analogous way as in the system according to FIG. 3A by feeding them via the second object transfer path 23 and the connected first object transfer path 21 through the Load Lock into the inner space of the exposure unit 1. If the opening 24 has a conventional FOUP interface, then a conventional FOUP substrate carrier can be used. Thus, the interface unit 20 allows to use conventional FOUP carrier for bypassing the track 10 of an EUV lithographic system.

The wafer handler of the EUV-system 26 in FIG. 3B has the functions of pre-alignment of the objects and temperature control of the objects. Additionally, the wafer handler may have the task to control the Load Lock. The Load Lock serves as a vacuum interface between the interface unit and the exposure unit. The load lock has a vacuum-interface-chamber configured to transfer objects from the atmospheric part of the lithographic system to the vacuum part of the system and vice versa. The vacuum-interface-chamber can alternatively be pumped to create vacuum and brought under a higher (atmospheric) gas pressure. An example of a sequence of events for feeding an object from an atmospheric to a vacuum condition may be as follows: Transfer an object through an opening into the vacuum-interface-chamber, close the chamber, pump the chamber vacuum, open the chamber, feed the object through the opening into a vacuum part of the system. During pumping vacuum of the vacuum-interface-chamber, the temperature of the object (substrate) in the vacuum-interface-chamber lowers. This temperature fall can be calculated on beforehand and used for compensating the temperature fall by pre-heating the substrate before pumping the vacuum-interface-chamber vacuum. This kind of temperature control can be performed by the wafer handler.

Figure 4:
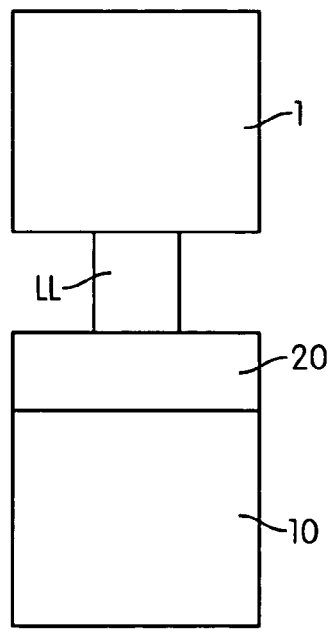
FIG. 4 depicts a lithographic exposure unit, a track and an interface unit according to an embodiment of the present invention.

FIG. 4 depicts a schematic view of an interface between the lithographic exposure unit 1 and the track 10 according to an embodiment of the present invention. In between the lithographic exposure unit 1, including the load lock LL, and the track 10, an interface unit 20 is provided, of which the main purpose is to overcome some of the problems that arise due to poor cooperation and communication between the lithographic exposure unit 1 and the track 10.

This interface unit 20 can be made as an integral part of the lithographic projection apparatus 1 in an embodiment of the invention. The interface unit could also be made as a part of the track 10, or as a separate box, that can be placed between an already existing lithographic projection apparatus 1 and track 10.

Figure 5:
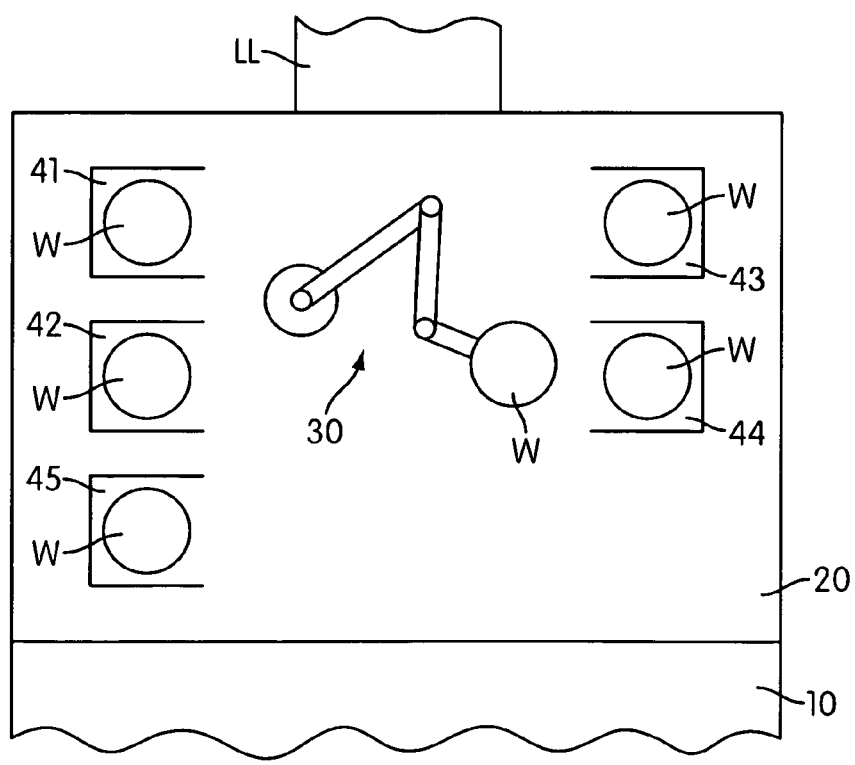
FIG. 5 depicts an interface unit according to an embodiment of the present invention and FIGS. 6a, 6b and 6c depict different ways of controlling the lithographic projection apparatus, the interface unit and the track according to an embodiment of the invention.

It will be appreciated that the interface unit 20 can be provided with a variety of functionality. Some of them will be discussed below with reference to FIG. 5.

First, the interface unit 20 can be provided with one or more substrate handling units, such as robot handlers 30. At the end of the robot handler 30 a gripper (not shown) is provided that is arranged to grip a substrate W. The robot handler 30 is thus arranged to pick up a substrate W at a first location and to deliver the substrate W at a second location. In a preferred embodiment, the robot handler 30 is long enough to hold and deliver substrates from and to the load lock LL and the track 10.

However, the interface unit 20 can also use a robot handler that is present in the lithographic projection apparatus and/or the track. In that case, no additional robot handler needs to be provided in the interface unit 20.

The interface unit 20 can further be provided with one or more stations, each having a certain functionality.

The interface unit 20 can be provided with a buffer station 41, arranged to store one or more substrates W. This buffer station 41 can be used to store one or more substrates W to smoothen temporal differences in the handling rate between the track 10 and the lithographic projection apparatus 1. The buffer station 41 can be used, for example, to store one or more substrates W that are delivered from the lithographic projection apparatus 1 towards the track 10. Accordingly, the lithographic projection apparatus 1 does not have to wait for the track 10 to be ready to receive a next substrate W. The lithographic projection apparatus 1 simply delivers the substrates W to the buffer station 41 and continues with the next substrate W. It will be appreciated that the same principle can be used vice versa for one or more substrate delivered from the track 10 towards the lithographic projection apparatus 1. The interface unit could also be provided with two buffer stations 41: one for storing one or more substrates W traveling from the lithographic projection apparatus 1 to the track 10, and one for storing one or more substrates W traveling from track 10 to the lithographic projection apparatus 1. This can be particularly useful when the handling rates of the lithographic projection apparatus 1 and the track are varying through time.

The interface unit 20 can also be provided with a cleaning station 42, provided with cleaning means such as devices to clean resist from the edges and backside of the substrate W and/or to clean contamination particles from the substrate W. The cleaning station 42 can further be provided with a contamination detecting system. Such a contamination detecting system can scan, for example, the substrate W with a laser in order to detect contamination particles. Such detection information may be used to help the cleaning process. The proposed cleaning devices and cleaning methods can also be applied in other parts of the lithographic system.

As stated before, the substrates to be exposed in the lithographic apparatus are normally coated and developed in a track. The coating process takes place before the substrate (wafer) is exposed in the exposure unit, the developing process takes place after the wafer is exposed. The exposure of a substrate is a very accurate activity. Any contaminants on the top and/or bottom surface may cause an inaccurate exposure, called a 'hotspot'. These hotspots may lead to yield loss for the customer. A 'hotspots' can result from a contamination on the substrate (wafer) or on the substrate table.

The inner space of a lithographic apparatus may become contaminated when contaminated substrates (wafers) are delivered into the apparatus. If contamination sticks onto the substrate wafer, this contamination may subsequently be transferred to one or more positions of the lithographic system where the contaminated wafer is handled (for example substrate-contact-places on the substrate table).

The inner space of an immersion lithographic apparatus may become contaminated during or after an immersion process. During the immersion process fluid is in direct contact with either the photoresist itself or a topcoat. After the immersion process (thus after exposure) the substrate (wafer) may still have (some) monolayers of fluid which can cause drying stains if the fluid is not uniformly evaporated.

In conventional lithographic systems, there is no check or detection to determine whether substrates that enter the lithographic apparatus are contaminated. This means that all handling positions that the contaminated substrates visits may get contaminated without any notice. This contamination can stick onto sensitive positions within the lithographic apparatus, resulting (in the end) in a situation whereby all following substrates are also contaminated in corresponding positions which subsequently are not correctly exposed (reducing yield and requiring rework).

The following two possible detection methods are proposed for supporting the operation of the cleaning station:

After exposure of a substrate, the image or pattern on the substrate is checked. If this check reveals that there is something wrong with this image/pattern the system is then subsequently checked if it also holds for other substrates. It may appear then that some or many substrates are affected meaning that a yield loss has occurred.

An inspection test is regularly run on the lithographic apparatus.

If one of the two detection methods reveals problems relating to contamination, then a solution is to open the lithographic system and to clean the dirty handling positions inside by hand. This implicates that a non-scheduled down of the lithographic apparatus has to be made.

In case of an immersion lithographic apparatus, defects generated at the immersion step (if not removed) may be "baked in" during the following PEB bake step (in the track) and further in the track process. The result may be an altered dissolution rate (exposed resist in developer) during development at the respective locations of defects and finally this may cause a CD change (=non uniformity) at the respective location.

According to an embodiment of the invention a method for cleaning and inspecting the Wafer Handler (Substrate Handler) and/or any other parts of the lithographic apparatus is provided.

Automatic inspection and/or cleaning of the substrate within the lithographic apparatus may be realized inside the Wafer Handler. As soon as the substrate is delivered by the track, the substrate may be taken from the exchange position and put into an inspection/cleaning device inside the substrate handling system. A good position for the inspection/cleaning device is on the exchange position in the Wafer Handler.

The inspection and/or cleaning device could be operated in the following ways:

The substrate is inspected only, not cleaned, but removed from the system.

This should result in preventing a contaminated substrate from entering the system any further.

The substrate is always cleaned, without inspection. This must then be performed on every substrate, regardless of any contaminants.

The substrate is inspected and if the inspection reveals that it contains contaminants then it will be cleaned.

An immersion lithographic apparatus may be provided with an inspection and/or cleaning device configured to inspect the substrates. When the inspection indicates contaminants (i.e. stains) on a particular substrate, then this substrate will be cleaned. The cleaning can be performed for example by (re)depositing a fluid on the entire substrate and drying it in a controlled manner (via spin dry, heat or others). This inspection/cleaning process offers the advantages that there is less yield and less loss/rework for the customer compared with conventional processes. Additionally, there is a reduced downtime (reduced maintenance) on the system according to the invention compared with conventional systems.

The inspection and/or cleaning device could be built in the space currently available for a loadport. It is also possible to expand the number of substrate input exchange positions and integrate the inspection and/or cleaning device with these input exchange positions.

The cycle time for inspection/cleaning depends on the number of inspection/cleaning devices, the inspection/cleaning strategy and the throughput of the system. For example: if only one inspection/cleaning device is available and every substrate should be inspected and/or cleaned, the required cycle time for inspection/cleaning (including the substrate exchanges) should be the same as the exposure cycle time (maximum).

The following inspection/cleaning strategies can be distinguished:

Only inspect and stop processing when a dirty substrate is found, this prevents the substrate from contaminating the scanner;

Only inspect and remove the substrate from the main stream, this prevents the substrate from contaminating the scanner and maintains the processing of substrates;

Only clean every substrate, this means that every substrate is cleaned regardless if the substrate is contaminated or not;

Inspect every substrate and clean when necessary, then all substrates can be handled and exposed via the normal scenario, no substrates are extracted from the main stream and it prevents the contaminated substrate from contaminating the scanner.

It is noted that inspection of the substrate may be (but is not limited to):

only inspect the backside of the substrate;

only inspect the topside of the substrate;

inspect all sides of the substrate;

using inline metrology.

Furthermore, it is noted that cleaning of substrates pertain to all means to clean all sorts of contamination of the substrate top and/or back side.

An example of an inspection system could be an optical inspection tool based upon the principle of beam reflection. An example of a cleaning system could be a rotating device using solvents to remove the dirt on the backside.

The interface unit 20 can further be provided with a pre-treatment station 43. In such a pre-treatment station 43 a substrate can undergo one or more treatments to prepare the substrate for entering the lithographic projection apparatus 1. Such a pre-treatment can be, for example, a pre-bake. During a pre-bake the substrate is heated to a particular temperature for a certain time-interval to let the resist outgas. Resist outgassing can be very harmful in clean and/or vacuum environment, such as in the load lock LL and the lithographic projection apparatus 1. Hence, such outgassing is promoted and/or permitted in the interface unit 20.

As discussed above, it is desirable that the time gap between the exposure and the post-exposure bake be small and constant. The line thickness of the projected pattern can change after the exposure and also the sharpness of the pattern can deteriorate over time. This deteriorating process stops as soon as the substrate W is subjected to appropriate post-exposure treatment. By providing the interface unit 20 with a post-treatment station 44, a constant time between the exposure and all or part of the appropriate post-treatment can be achieved. Substrates that arrive from the lithographic projection apparatus 1 can undergo, for example, a post-exposure bake in the post-treatment station 44.

Other stations can also be provided in the interface unit 20. It is possible, for example, to measure characteristics of the substrate W before it enters the load lock LL and/or the lithographic projection apparatus 1. Such characteristics can include alignment information. This can increase the handling rate of the lithographic projection apparatus 1 since the substrate W can be positioned at the substrate stage WS more quickly.

The interface unit 20 could further be provided with an exchange station 45 configured to exchange substrates W to and from the outside world. Such an exchange station 45 can be provided with an interface for a carrier, such as a FOUP-interface, that is arranged to engage with a carrier in order to receive or deliver substrates W from or to the interface unit 20, instead of exchanging substrates W with the lithographic projection apparatus 1 or the track 10.

Such an exchange station 45 can be particularly useful in situations where the track 10 is out of order or substrates W need to be cycled through the lithographic projection apparatus 1 that do not need to be cycled through the track 10.

It will be appreciated that the interface unit 20 does not necessarily have to embody all the stations mentioned above, and could also be provided with other stations having other functions. Also stations that are arranged to carry out one or more of the identified functions can be provided, in an embodiment of the invention.

Figure 6A:
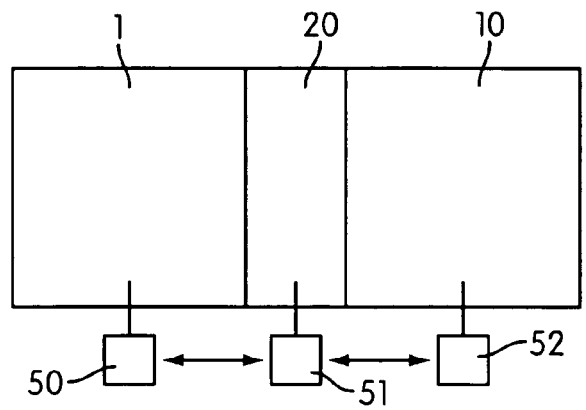
Figure 6B:
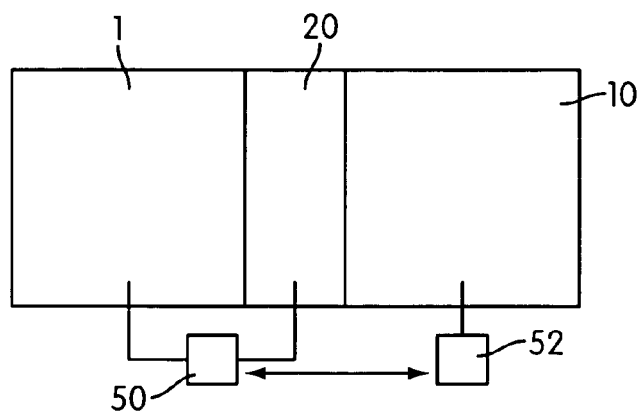
Figure 6C:
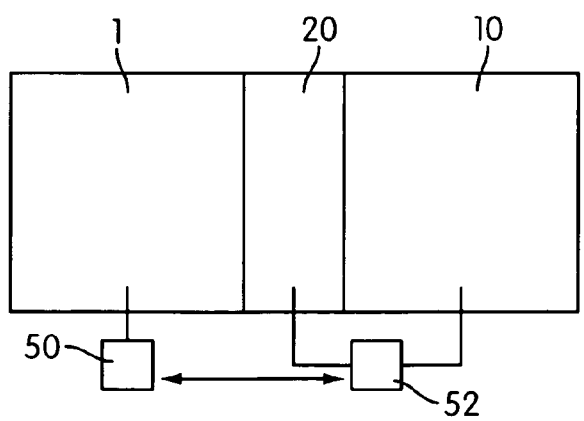

The interface unit 20 delivers and receives substrates W from the lithographic projection apparatus 1 and the track 10, and also performs tasks in the processing stations present in the interface unit 20. Exchanging information with the lithographic projection apparatus 1 and the track is crucial for an optimum performance. FIGS. 6a, 6b and 6c show different ways of controlling the interface unit 20.

FIG. 6a depicts the lithographic projection apparatus 1, the interface unit 20 and the track 10. The lithographic projection apparatus 1 is provided with a control unit 50, the interface with a control unit 51 and the track with a control unit 52. As indicated by the arrows, some of the control units 50, 51; 51, 52 are arranged to communicate with each other and exchange information and calls. The control unit 50 of the lithographic projection apparatus 1 can send, for example, a call to the control unit 51 of the interface 20 asking for one or more new substrates W. The interface unit 20 can respond to that by providing the one or more new substrates W to the lithographic projection apparatus 1. In case the control unit 51 of the interface unit 20 notices that no substrate W is available anymore in the interface unit, or the number of available substrates W is below a certain threshold, it can send a call to the control unit 52 of the track 10 asking for new substrates W.

In an alternative embodiment, the control unit 50 of the lithographic projection apparatus 1 and the control unit 52 of the track are arranged to directly communicate with each other.

FIG. 6b depicts an alternative embodiment in which the interface unit 20 is directly controlled by the control unit 50 of the lithographic projection apparatus 1. In this case, no separate control unit 51 of the interface unit 20 is needed. In this case, the control unit 50 of the lithographic projection apparatus 1 and the control unit 52 of the track 10 are arranged to communicate with each other and exchange information and calls.

FIG. 6c depicts yet an alternative embodiment in which the interface unit 20 is directly controlled by the control unit 52 of the track 10. Again, no separate control unit 51 of the interface unit 20 is needed. The control unit 50 of the lithographic projection apparatus 1 and the control unit 52 of the track 10 are arranged to communicate with each other and exchange information and calls.

The embodiments depicted in FIGS. 6a, 6b and 6c all show a direct coupling between the lithographic projection apparatus 1 and the interface unit 20. However, it will be understood that the lithographic projection apparatus 1 and the interface unit 20 may also be coupled with a load lock LL.

The embodiment described with reference to FIG. 6a might advantageously be used in case the interface unit 20 is provided with a separate robot handler 30. In case the interface unit 20 has no separate robot handler 30, but uses the robot handler 30 present in the track 10 or the lithographic projection apparatus 1, the embodiments described with reference to FIGS. 6b and 6c may respectively be advantageously used. However, since some of the control units 50, 51, 52 are arranged to communicate with each other and are thus also able to send calls to other control units asking to use their robot handlers 30, other combinations may also be applied.

While specific embodiments of the invention have been described above, it will be appreciated that the invention may be practiced otherwise than as described. The description is not intended to limit the invention.

What is claimed is:

1. An interface unit comprising:
   a first object transfer path to transfer objects between a track configured to process objects and a lithographic exposure unit configured to expose objects, and
   a second object transfer path that extends through a closable transfer opening to an external space, the second object transfer path configured to facilitate the transfer of objects between the external space and the lithographic exposure unit,
   wherein the transfer of objects using the second object transfer path is controlled with a control unit.

2. The interface unit of claim 1, wherein the first object transfer path is coupled to the second object transfer path.

3. The interface unit of claim 1, wherein the closable transfer opening comprises a front opening universal pod interface configured to engage with a front opening universal pod.

4. An interface unit comprising:
   a first object transfer path to transfer objects between a track configured to process objects and a lithographic exposure unit configured to expose objects, and
   a second object transfer path that extends through a closable transfer opening to an external space, the second object transfer path configured to facilitate the transfer of objects between the external space and the lithographic exposure unit,
   wherein the interface unit is configured to be coupled to a Load Lock of said lithographic exposure unit having an enclosed vacuum space provided with a second opening closable by the Load Lock, wherein the first object transfer path extends through the second opening into the vacuum space.

5. The interface unit of claim 1, wherein the interface unit is configured to be coupled to the lithographic exposure unit and the track.

6. The interface unit of claim 1, further comprising a robot handler configured to transfer the objects.

7. The interface unit of claim 1, further comprising at least one station configured to hold the objects in the interface unit.

8. The interface unit of claim 7, wherein the at least one station comprises a buffer station configured to temporarily store one of said objects.

9. The interface unit of claim 7, wherein the at least one station comprises a cleaning station configured to clean one of said objects.

10. The interface unit of claim 7, wherein the at least one station comprises a pre-treatment station configured to treat one of said objects before exposing the object in the lithographic exposure unit.

11. The interface unit of claim 7, wherein the at least one station comprises a post-treatment station configured to treat one of said objects after the object is transferred from the lithographic exposure unit to the interface unit.

12. The interface unit of claim 1, further comprising a control unit configured to communicate with a control unit of the lithographic exposure unit and/or a control unit of the track.

13. A lithographic apparatus comprising:
(a) a lithographic exposure unit including:
  a radiation system configured to provide a beam of radiation;
  a support structure configured to support a patterning device that imparts a desired pattern to the beam of radiation;
  a substrate holder configured to hold a substrate; and
  a projection system configured to project the patterned beam of radiation onto a target portion of the substrate,
(b) an interface unit coupled to the lithographic exposure unit, the interface unit including:
a first object transfer path to transfer the substrate between a track configured to process substrates and the lithographic exposure unit configured to expose substrates, and
  a second object transfer path that extends through a closable transfer opening to an external space, the second object transfer path configured to facilitate the transfer of the substrate between the external space and the lithographic exposure unit,
wherein the transfer of the substrate using the second object transfer path is controlled with a control unit.

14. A device manufacturing method comprising:
transferring a substrate to an exposure unit or a track unit via a first or a second object transfer path of an interface unit coupled to said exposure unit and said track unit, the first object path extending between the track unit and the exposure unit and the second object transfer path extending through a closable transfer opening to an external space, the second object transfer path configured to facilitate the transfer of objects between the external space and the exposure unit;
providing a beam of radiation using a radiation system;
patterning the beam of radiation with a pattern in its cross-section;
projecting the patterned beam of radiation onto a target portion of a layer of radiation-sensitive material on said substrate and
controlling the transfer of the objects between the external space and the exposure unit using the second object transfer path with a control unit.

15. The device manufacturing method of claim 14, further comprising pre-processing said substrate in said interface unit before projecting the patterned beam of radiation.

16. The device manufacturing method of claim 14, further comprising post-processing said substrate in said interface unit after projecting the patterned beam of radiation.

17. A lithographic system comprising:
a lithographic exposure unit configured to expose a substrate;
a track unit comprising a plurality of processing stations configured to process said substrate; and
an interface unit operatively associated with said lithographic exposure unit and said track unit, said interface unit being configured to transfer said substrate between said lithographic exposure unit and said track unit, said interface unit being further capable of receiving a substrate from a structure other than said lithographic exposure unit or said track unit and further capable of transferring said substrate from said other structure to said lithographic exposure unit and/or said track units,
wherein said interface unit comprises a first object path to transfer said substrate between said lithographic exposure unit and said track unit and a second object path configured to transfer said substrate between said lithographic exposure unit and said structure,
wherein said interface unit includes a closable opening through which said second object path extends, and
wherein a transfer of the substrate using the second object transfer path is controlled with a control unit.

18. The lithographic system of claim 17, further comprising a load lock unit arranged between said lithographic exposure unit and said interface unit.

19. The lithographic system of claim 17, wherein said interface unit includes at least one exchange station configured to transfer said substrate between said structure and said interface unit and at least one processing station configured to process said substrate.

20. The lithographic system of claim 19, wherein said at least one processing station is a cleaning station, a pre-exposure station, or a post-exposure station.

21. The lithographic system of claim 19, wherein said interface unit further comprises at least one buffer station.

22. The interface unit of claim 1, wherein the control unit is a control unit of the lithographic exposure unit, the track unit or the interface unit.

23. The lithographic apparatus of claim 13, wherein the control unit is a control unit of the lithographic exposure unit, the track unit or the interface unit.

24. The device manufacturing method of claim 14, wherein the control unit is a control unit of the lithographic exposure unit, the track unit or the interface unit.

25. The lithographic apparatus of claim 17, wherein the control unit is a control unit of the lithographic exposure unit, the track unit or the interface unit.

* * * * *